United States Patent
Zhang et al.

(10) Patent No.: US 10,644,044 B2
(45) Date of Patent: May 5, 2020

(54) METHODS OF MANUFACTURING PRINTABLE PHOTODETECTOR ARRAY PANELS

(71) Applicant: National Research Council of Canada, Ottawa (CA)

(72) Inventors: Zhiyi Zhang, Ottawa (CA); Ye Tao, Orleans (CA); Heping Ding, Ottawa (CA); Salima Alem, Ottawa (CA); Shoude Chang, Ottawa (CA)

(73) Assignee: National Research Council of Canada, Ottawa, ON (CA)

( * ) Notice: Subject to any disclaimer, the term of this patent is extended or adjusted under 35 U.S.C. 154(b) by 0 days.

(21) Appl. No.: 15/994,988

(22) Filed: May 31, 2018

(65) Prior Publication Data

US 2019/0371834 A1   Dec. 5, 2019

(51) Int. Cl.
| | |
|---|---|
| *H01L 27/144* | (2006.01) |
| *H01L 31/0224* | (2006.01) |
| *H01L 31/0256* | (2006.01) |
| *H01L 27/146* | (2006.01) |
| *H01L 31/18* | (2006.01) |
| *G09G 3/3216* | (2016.01) |

(52) U.S. Cl.
CPC ...... *H01L 27/1446* (2013.01); *H01L 31/0224* (2013.01); *H01L 31/0256* (2013.01); *H01L 31/18* (2013.01); *G09G 3/3216* (2013.01); *H01L 27/14643* (2013.01)

(58) Field of Classification Search
None
See application file for complete search history.

(56) References Cited

U.S. PATENT DOCUMENTS

| | | | |
|---|---|---|---|
| 3,551,761 A | 12/1970 | Ruoff et al. | |
| 3,855,582 A | 12/1974 | Roberts | |
| 4,604,527 A | 8/1986 | Chenevas-Paule et al. | |
| 4,906,855 A | 3/1990 | Berger et al. | |
| 5,229,858 A | 7/1993 | Ikeda et al. | |
| 5,422,511 A | 6/1995 | Hosokawa et al. | |

(Continued)

OTHER PUBLICATIONS

Braun, D., & Yu, G. Simulations of Passive Matrix Polymer Image Sensors. MRS Proceedings, 558, 339, 1999.

(Continued)

*Primary Examiner* — Bo B Jang
(74) *Attorney, Agent, or Firm* — Moffat & Co.

(57) ABSTRACT

Methods are provided for fabricating photodetector arrays using passive matrix addressing technology. The photodetector arrays use a pair of switching diode and photo diode to overcome crosstalk issues within the passive matrix. The switching diode and the photo diode of each pixel may be connected using a cathode-to-cathode connection, or an anode-to-anode connection. The photodetector arrays are fabricated by assembling on a first substrate, an array of photodetector pixels comprising a switching diode and a photo diode, providing conductive lines for each row of the array and conductive lines for each column of the array, and attaching a second substrate to the first substrate. The photodetector array may also be fabricated by assembling on a first substrate an array of switching diodes, and assembling on a second substrate an array of photo diodes, and bonding the first and second substrates together.

12 Claims, 14 Drawing Sheets

(56) References Cited

U.S. PATENT DOCUMENTS

| | | | |
|---|---|---|---|
| 5,523,554 | A | 6/1996 | Hassler et al. |
| 6,303,943 | B1 | 10/2001 | Yu et al. |
| 6,480,182 | B2 | 11/2002 | Turner et al. |
| 6,534,333 | B2 | 3/2003 | Bird et al. |
| 6,549,684 | B2 | 4/2003 | Bird |
| 6,707,497 | B1 | 3/2004 | Pantigny et al. |
| 6,980,196 | B1 | 12/2005 | Turner et al. |
| 6,989,806 | B2 | 1/2006 | So et al. |
| 7,573,024 | B2 | 8/2009 | Knopf et al. |
| 7,972,875 | B2 | 7/2011 | Rogers et al. |
| 8,722,458 | B2 | 5/2014 | Rogers et al. |
| 2003/0089252 | A1 | 5/2003 | Samecki |
| 2016/0286146 | A1 | 9/2016 | Wirth et al. |
| 2016/0313769 | A1* | 10/2016 | Yoshitani ............. G04G 17/045 |

OTHER PUBLICATIONS

Jennings, M. "Powering Passive OLED Displays in Handhelds", Power Electronics Technology, Feb. 2006.

Braun, D. "Crosstalk in passive matrix polymer LED displays", Synthetic Metals, vol. 92, Issue 2, pp. 107-113 Jan. 30, 1998.

Lilja, K., Backlund, T., Lupo, D., Virtanen, J., Hamalainen, E., Joutsenoja, T. "Printed organic diode backplane for matrix addressing an electrophoretic display", Thin Solid Films, 518, pp. 4385-4389, Feb. 10, 2010.

International Search Report and Written Opinion, PCT/CA2019/050644, dated Jul. 22, 2019.

\* cited by examiner

METHODS OF MANUFACTURING PRINTABLE PHOTODETECTOR ARRAY PANELS

FIELD OF THE DISCLOSURE

The present disclosure relates generally to printable electronic array panels, and more specifically to an improved array panel, a method of manufacture of printable electronic array panels, and a method of addressing sensors within an array panel.

BACKGROUND

Passive Matrix (PM) addressing is a technology used in early Liquid Crystal Displays (LCD). Passive matrix addressing uses one group of parallel conductors as column electrodes, and another group of parallel conductors as row electrodes to form a grid structure. Liquid crystal pixels are sandwiched between the column electrodes and the row electrodes. Each pixel is controlled by an intersection of the row and column electrodes. By applying a proper voltage at an intersection, the liquid crystal responds by creating an "on" state at that intersection. By using this scheme, only (m+n) control signals are required to address a display with n columns and m rows. The signal is divided into a row signal and a column signal. The row voltage determines the row being addressed and all n pixels on a row are addressed simultaneously. When pixels on a row are being addressed, a selection potential ($V_{sel}$) is applied to that row, and a non-selection potential ($V_{unsel}$) is applied to all other rows. The column potential is then applied with a potential for each column individually. In a display, an on (lit) pixel corresponds to a potential of $V_{on}$, and an off pixel corresponds to a potential of $V_{off}$.

An example of a display using passive matrix addressing is illustrated in FIG. 1. Specifically, as shown in FIG. 1, a two-dimension array 100 has a plurality of rows and columns. A column is selected by applying a column signal as shown by arrow 110, and a row is selected by applying a row signal as shown by arrow 120. As a result of the column signal and the row column being applied, the pixel corresponding to the selected row and the selected column is turned on.

Passive matrix technology is a low cost solution and is easy to implement. However, problems arise as the number of rows and columns increase. With higher pixel density, the electrode size must be reduced and the amount of voltage necessary to drive the display rapidly increases. The higher driving voltage creates the secondary problem of cross-talk. Even though only one row and column are selected, liquid crystal material near the row and column being charged are affected by the pulse. The net result is that the selected pixel is active, and pixels surrounding the selected pixel are also partially active. The partially active pixels reduce the display contrast and degrade image quality.

Passive matrix addressing has also been used in Organic Light Emitting Diode (PMOLED) based displays, especially in small size displays. Although the concept of the PMOLED structure is relatively straightforward to design and fabricate, PMOLED displays also face cross-talk issues. As a result, PMOLED displays are normally most suited to display applications where the display size is less than about 50 millimeters to 80 millimeters across the diagonal or where there are less than about 100 rows. As analyzed by D. Braun in his paper "Crosstalk in passive matrix polymer LED displays", Synthetic Metals (1998) 92, p. 107-113, there are serious cross-talk issues in a passive matrix structure.

Reference is now made to FIG. 2A, in which a passive matrix array of LEDs is shown. In FIG. 2A, rows 1 through 4 form the cathode electrodes, and columns A through D form the anode electrodes. As current is applied through LED A1, some of that current may also flow through series of LEDs A2, B2, and B1; through LEDs A2, C2, and C1; through LEDs A4, B4, and B1, amongst other combinations, as illustrated in FIG. 2B. In each case, two LEDs are forward biased and one is reverse biased. With LEDs acting like ideal diodes, the reverse-based LEDs would not permit any current flow, and no light could emerge from the forward-biased LEDs. However real LEDs do permit some current to flow under reverse bias, and several reverse-biased LEDs in parallel can pass enough current to allow light emission from another LED in series. For example, pixel A2 lies in series with pixels B2, C2, and D2. Even a low-information-content display would have more than 4×4 pixels, and therefore more parallel conductions paths typically exist.

According to Braun, ibid, there are several potential sources of direct current (DC) cross-talk in LED matrix displays.

Display resolution: the greater number of pixels required for higher-resolution displays creates more available parallel conduction paths, so one would predict more stray light in higher-resolution displays.

Rectification ratio: one rough way to characterize diode quality is in terms of the ratio of current flowing in forward bias to that flowing under the same magnitude reverse bias. A higher rectification ratio indicates that less leakage current flows for a given magnitude bias, so less stray light should occur with higher-rectification devices.

Reverse leakage current: another way to characterize the reverse-bias quality of a diode is in terms of the parallel leakage paths that compromise the diode action under reverse bias. Larger reverse leakage current would increase the stray light generated.

The passive matrix addressing scheme has also been applied to photodetector arrays due to its simple design and ease of fabrication. The issue of cross-talk however gets even worse in PM photodetector arrays because of the orders of magnitude lower rectifying ratio of the photo detectors under illumination. FIG. 3 shows current-voltage characteristics of a typical organic solar cell in the dark and under irradiation, and illustrates a worsened rectifying ratio under light.

Therefore, serious cross-talk issues exist in passive matrix photodetector arrays. U.S. Pat. No. 6,303,943 to Yu et al. proposes to use switchable photosensitivity of specially designed photodiodes to achieve a switching effect in an attempt to overcome cross-talk issues in a passive photodetector array, where the photosensitivity can be switched on and off by the biasing voltage across the detectors, where the switching voltage imparts photosensitivity above 1 mA/W at a preselected operating bias and near zero photosensitivity at a cut-off bias substantially equivalent in magnitude to the built-in potential of the photodetector. The photocurrent can be probed with a read-out circuit in the loop. These photodetectors can be arranged in linear arrays or in two-dimensional matrices that function as linear or two-dimensional image sensors. "Simulations of Passive Matrix Polymer Image Sensors", by D. Braun and G. Yu, MRS Proceedings, 1999, 558, propose a similar system.

A more commonly used solution to overcome the cross-talk issue is to use an active matrix arrangement where arrays of transistors are connected to pixels, functioning as switches to turn on and off the pixel current path. However, this approach is very expensive.

Cross-talk in passive matrix addressing can also be controlled by using an array of diodes as switchers by controlling the bias direction and threshold voltage. For example, in a photodetector array, each photodetector will connect to a non-photosensitive switching diode in a head-to-head or tail-to-tail fashion. This arrangement is relatively easy to implement. Similar structures were used by others in some x-ray detectors and image sensors using traditional semiconductor materials such as in U.S. Pat. No. 4,604,527 to Chenevas-Paule et al., U.S. Pat. No. 5,229,858 to Ikeda et al., and U.S. Pat. No. 5,523,554 to Hassler et al.

Reference is now made to FIG. 4A and FIG. 4B, which illustrate a scheme whereby a switching diode is used to control when current can flow. In FIG. 4A, a negative voltage $V_{off}$ is applied to the circuit and the switching diode 410 is turned off. As a result of the switching diode being turned off, no current may flow through photo diode 420. In FIG. 4B, a positive voltage $V_{on}$ is applied to the circuit and the switching diode 410 is turned on. As a result of the switching diode being turned on, current may flow through photo diode 420.

The above described methods are relatively easy to implement in the Si-microelectronics industry, due to the high precision of fabrication processes, well defined layer thickness, and extremely low variations among produced devices in Si electronics. However, the same device arrangement is not straightforward to implement in the printable electronics industry, where the layer-to-layer alignment accuracy is low, printing resolution is limited to about 100 micrometers, printed layers are subject to large thickness variation, and where there are large performance variation and low yield.

SUMMARY

The present disclosure is directed to a method of fabricating a photodetector array, comprising assembling, on a face of a first substrate, an array of photodetector pixels, wherein each photodetector pixel comprises a switching diode and a photo diode, the switching diode and the photo diode being connected with a cathode-to-cathode connection; forming, for each row of the array, first conductive lines connecting each pixel within their respective row; applying a conductive adhesive at a bonding section of each photodetector pixel; forming, on a face of a second substrate, second conductive lines for each column of the array; placing dielectric material on each second conductive line; bonding the face of the first substrate with the face of the second substrate using the conductive adhesive; placing a light exposure mask over the array, wherein the light exposure mask exposes every photo diode; wherein the position of the dielectric material corresponds to areas where the first conductive lines and the second conductive lines intersect.

The present disclosure is also directed to a photodetector array comprising a first substrate having assembled thereon an array of photodetector pixels, wherein each photodetector pixel comprises a switching diode and a photo diode, the switching diode and the photo diode being connected with a cathode-to-cathode connection; in each row of the array, a first conductive line connecting each pixel within their respective row; conductive adhesive in a bonding section of each pixel; in each column of the array, a second conductive line connecting each pixel within their respective column, the second conductive line being electrically insulated from the first conductive lines by dielectric material; a second substrate covering the array of photodetector pixels; a light exposure mask over the second substrate, wherein the light exposure mask exposes every photo diode.

BRIEF DESCRIPTION OF THE DRAWINGS

The present disclosure will be better understood having regard to the drawings in which.

DETAILED DESCRIPTION OF THE DRAWINGS

Figure 1:
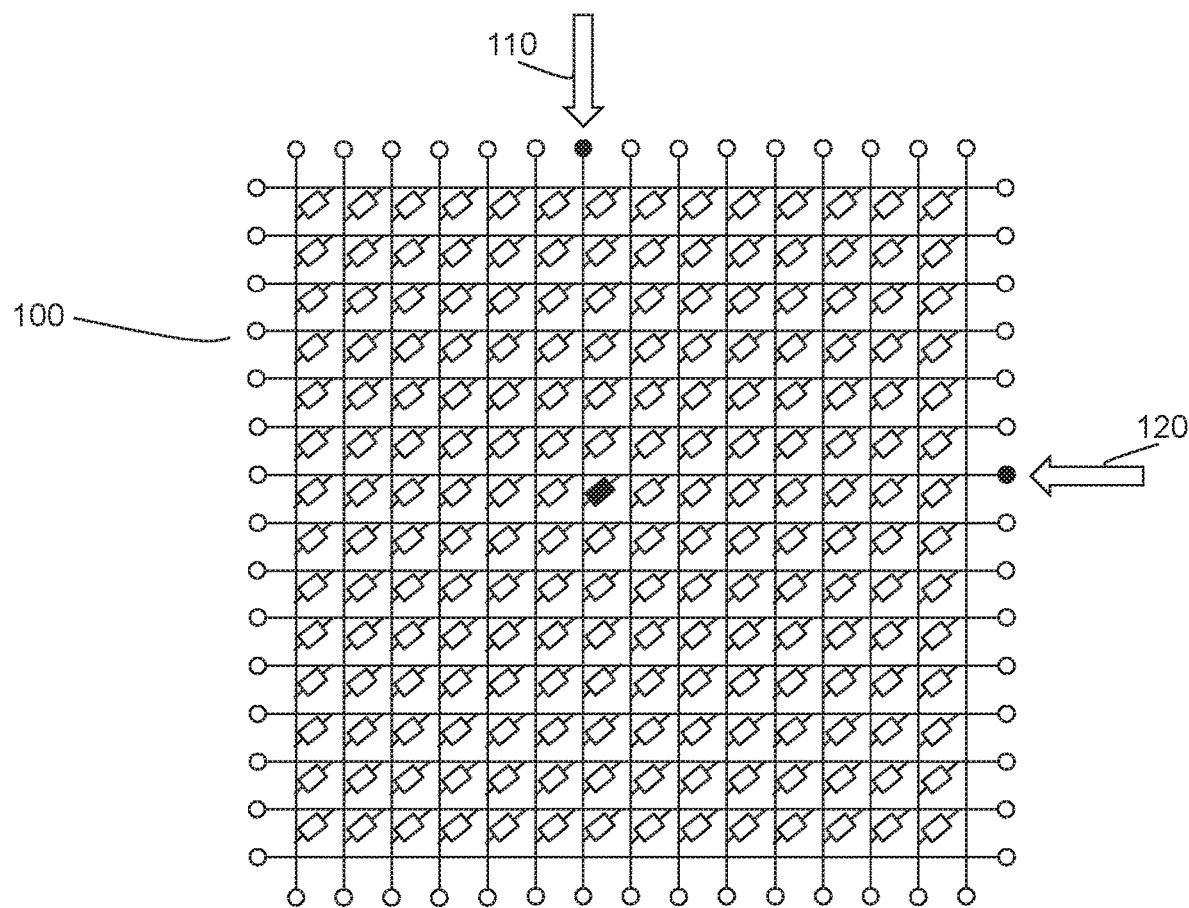
FIG. 1 is a schematic diagram of a passive matrix.
Figure 2B:
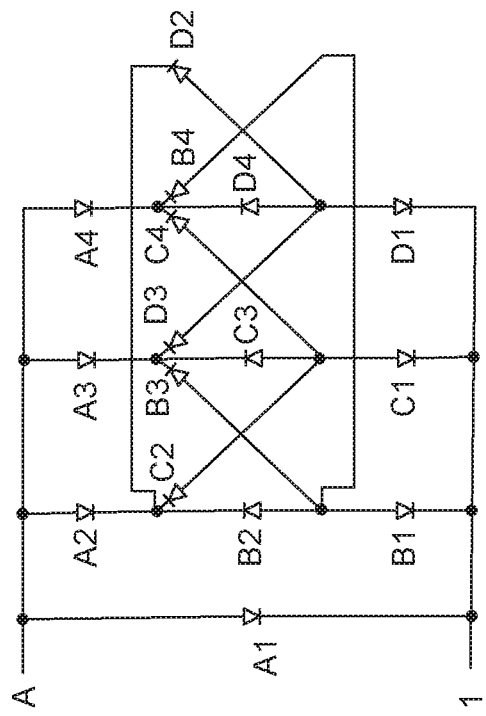
FIG. 2B is a schematic diagram of a perceived circuit due to reverse bias current flow.
Figure 2A:
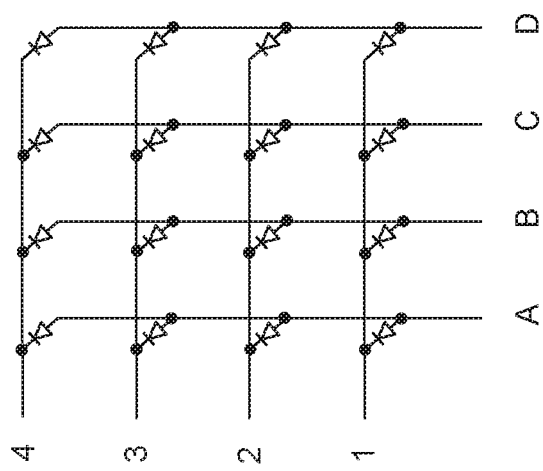
FIG. 2A is a schematic diagram of a passive matrix array of Light Emission Diodes (LEDs)
Figure 3:
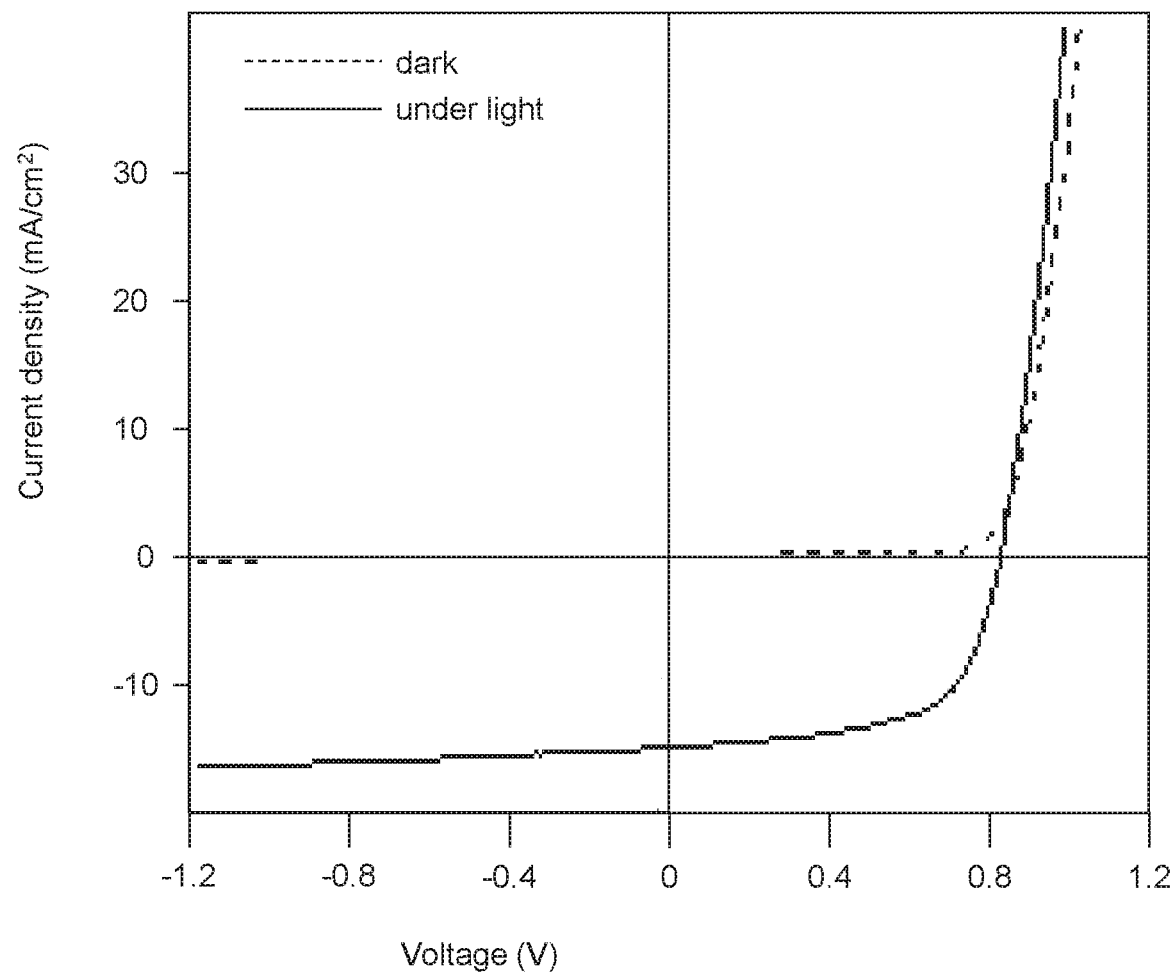
FIG. 3 is a graphical representation of current density at different voltages under different illumination conditions.
Figure 4A:
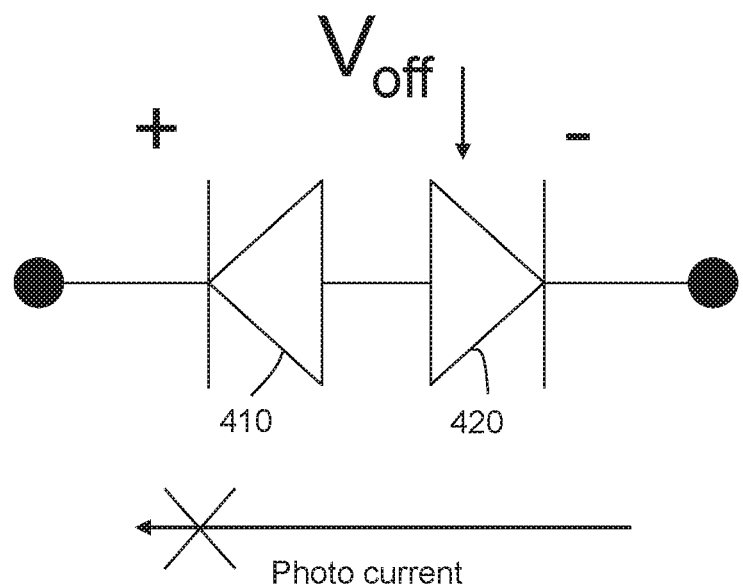
FIG. 4A is a schematic diagram of a switching diode paired with a photo diode.
Figure 4B:
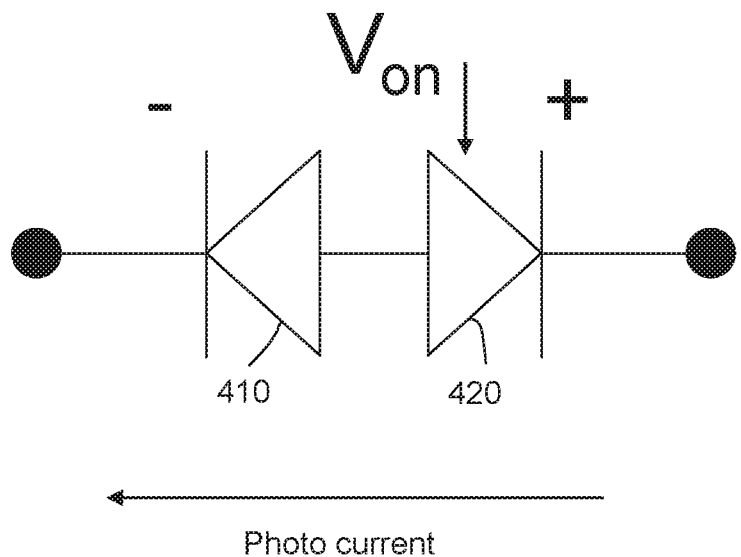
FIG. 4B is a schematic diagram of a switching diode paired with a photo diode.

The present disclosure provides a set of device layouts and fabrication processes to implement a switch-diode based back plane and photodetector array which overcome the large performance variation and low yield of the prior art.

The present disclosure further provides a printable flexible large area organic photodetector array panel and a method of manufacturing a printable flexible large area organic photodetector array panel. The array panel may be built on a flexible polymer substrate using printable organic materials and metal inks. The array panel may have a size of over 100 cm$^2$, such as 500 to 10000 cm$^2$ for example, and may consist of hundreds, thousands, or even more photodetector cells. According to at least some embodiments, a photodetector array may provide detection resolution in the millimeter range and could be used for the individual detection of a single or multiple objects, grouped detection of multiple objects, and movement tracking of a single or multiple objects, amongst other applications.

According to at least some embodiments, the array panel uses a switching-diode array based passive matrix design, which are less expensive than Thin Film Transistors (TFT) active matrix designs. In these embodiments, each photodetector cell consists of a connected pair of one switching diode and one photo diode. The switching diode blocks the current inflow from other cells to its paired photo detector, and thereby eliminates crosstalk in the array. The connection of each switching diode to its paired photo diode can be an anode-to-anode connection or a cathode-to-cathode connection.

According to at least some embodiments, arrays with anode-to-anode connection (or head-to-head connection) may be manufactured by fabricating a switching diode array and a photo diode array separately, flipping over one of the switching diode array and the photo diode array, and connecting each switching diode to its paired photo diode with a conductive adhesive.

In one example, a 16×16 switching diode array was prepared by first blade coating ZnO nano particles and poly(carbazole-dithiophene-benzothiadiazole) (PCDTBT) subsequently on a patterned indium tin oxide (ITO) polyethylene terephthalate (PET) film, and then depositing patterned MoO$_x$ and Ag in sequence. A 16×16 photo diode array was also prepared in a similar manner but with the PCDTBT replaced with a blend of PCDTBT and [6,6]-phenyl-C71-butyric acid methyl ester (PC$_{70}$BM), PCDTBT:PC$_{70}$BM. Then, a silver flake-based conductive epoxy adhesive was applied on the bonding section of each switching diode. In at least one embodiment, the adhesive is applied to a bonding section of each photo diode. The switching diode array was then bonded to the photo diode array by aligning their respective bonding sections to produce a photodetector array.

In at least some embodiments, the blade coating described in the above example can be replaced with slot die coating and the deposition of MoOx and Ag can be replaced by flexo printing or gravure printing of a vanadium oxide solution, and flexo printing or gravure printing of silver nano particle ink.

With the above method, both the switching diode array and the photo diode array can be fabricated separately with their respective optimized material system, device structure and processes. As such, it is easy to control array quality.

Figure 5A:
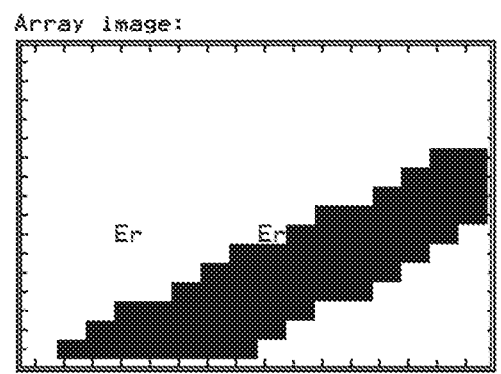
FIG. 5A is a captured image using a photodetector array according to at least one embodiment of the present disclosure.
Figure 5B:
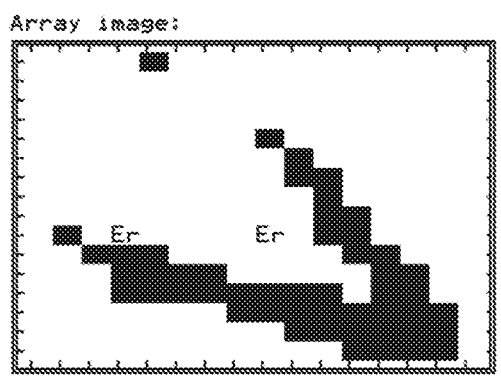
FIG. 5B is a captured image using a photodetector array according to at least one embodiment of the present disclosure.

FIGS. 5A and 5B show images captured using the photodetector fabricated as described above under lighting conditions of office ceiling lights and uncovered window. Specifically, FIG. 5A is an image of a black ruler, and FIG. 5B is an image of a pair of scissors.

Figure 6A:
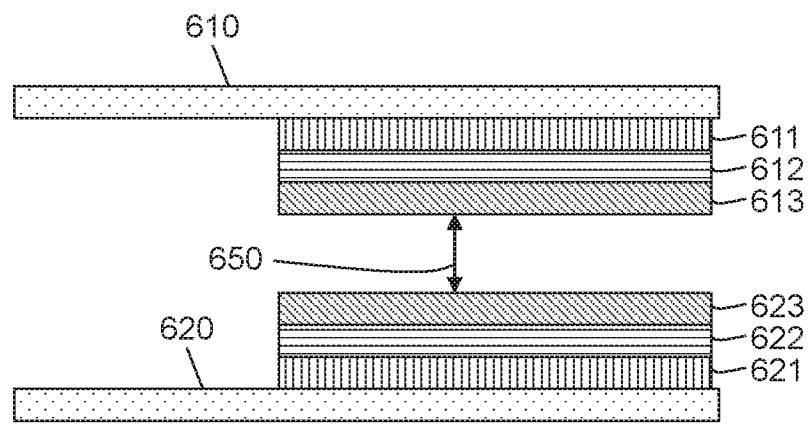
FIG. 6A is a cross-sectional view of a photodetector array according to at least one embodiment of the present disclosure.

Reference is now made to FIG. 6A, in which a cross sectional view of a photodetector array according to at least one embodiment of the present disclosure is shown. The photodetector array comprises a first substrate 610, on which a layer of ITO 611 is patterned, followed by a layer of active material 612, and a layer of Ag 613.

The photodetector of FIG. 6A further comprises a second substrate 620, with the layers of ITO 621, active material 622, and Ag 623. The combination of layers 611, 612, and 613, and layers 621, 622, and 623, make up the switching diode and the photo diode respectively. In between the first layer of Ag 613 and the second layer of Ag 623 is bonding area 650. The bonding area 650 is where adhesive is placed to connect the array on substrate 610 with the array on substrate 620. In the embodiment of FIG. 6A, the bonding area is directly aligned with the switching diode and the photo diode.

Figure 6B:
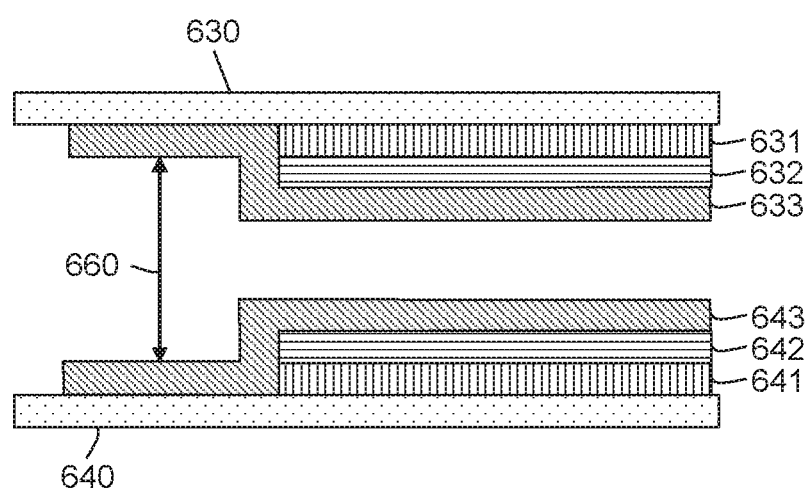
FIG. 6B is a cross-sectional view of a photodetector array according to at least one embodiment of the present disclosure.

Reference is now made to FIG. 6B, in which a cross sectional view of a photodetector array according to at least another embodiment of the present disclosure is shown. As in the case of FIG. 6A, the photodetector comprises a first substrate 630, on which a layer of ITO 631 is patterned, followed by a layer of active material 632, and a layer of Ag 633. The photodetector further comprises a second substrate 640 with a layer of ITO 641, active material 642, and Ag 643. However, unlike the embodiment of FIG. 6A, the embodiment shown in FIG. 6B has a bonding area 660 positioned away from the switching diode and the photo diode. Specifically, the Ag layers 633 and 643 extend past layers 631 and 632, and 641 and 642, respectively, to define an area 660 away from the switching diode and the photo diode. The bonding area 660 can be used to apply adhesive and bond the photo diode and the switching diode together. By having the bonding area away from the photo diode and switching diode as in FIG. 6B, no stress is incurred by the diodes from the process of bonding and the curing of the adhesive, thereby increasing yield.

Figure 7:
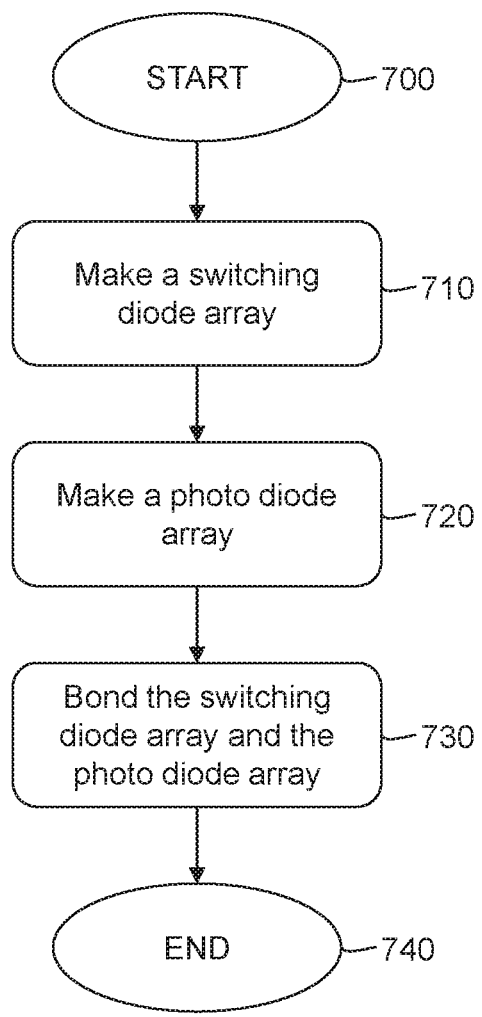
FIG. 7 is a flow diagram illustrating a method of fabricating a photodetector array according to at least one embodiment of the present disclosure.

Reference is now made to FIG. 7 which illustrates a method to fabricate a photodetector array according to at least one embodiment of the present disclosure.

The method begins at block 700 and proceeds to block 710 where a switching diode array is fabricated. The switching diode array may be fabricated as described above, namely by applying ITO, PCDTBT, ZnO nano particles, Ag and MoO$_x$, successively on a PET film. However the present disclosure is not limited to these materials and other appropriate materials may be selected by those skilled in the art. Furthermore, while the above example describes techniques such as blade-coating, patterning, and depositing, other appropriate techniques may be selected by those skilled in the art.

The method proceeds to block 720 where a photo diode array is fabricated. Once again, the photo diode array may be fabricated using the above described materials and techniques or other suitable materials and techniques as understood by those skilled in the art may be used.

At block 730, the switching diode array and the photo diode array are aligned and bonded together, such that each switching diode of the switching diode array is connected to a photo diode of the photo diode array. According to at least one embodiment, a conductive adhesive is applied to a bonding section of each switching diode. Switching diodes are then aligned with a corresponding photo diode and bonded. In at least one embodiment, the bonding section is between the switching diode and the photo diode, as illustrated above with respect to FIG. 6A. In at least another embodiment, the bonding section is to the side of the switching diode and the photo diode, as illustrated with respect to FIG. 6B.

The method then proceeds to block 740 and ends.

Due to extremely stringent requirement on film quality of the involved photo diodes and switching diodes, generally only a batch-based sheet-to-sheet printing process is suitable for the array fabrication. This process unfortunately may put a limit on the achievable array size. For instance, 100 cm$^2$ is a size limit for a typical research lab printing system and 400 cm$^2$ is a typical limit for a pilot facility. The present disclosure therefore proposes a method to overcome the size limitation while satisfying device quality requirements. This method comprises fabricating the arrays in a controllable size using a sheet-to-sheet process first, and then integrating several of those arrays on one common substrate to obtain an array module, and connecting several modules in multiplex to obtain the panel with a desired size.

Figure 8:
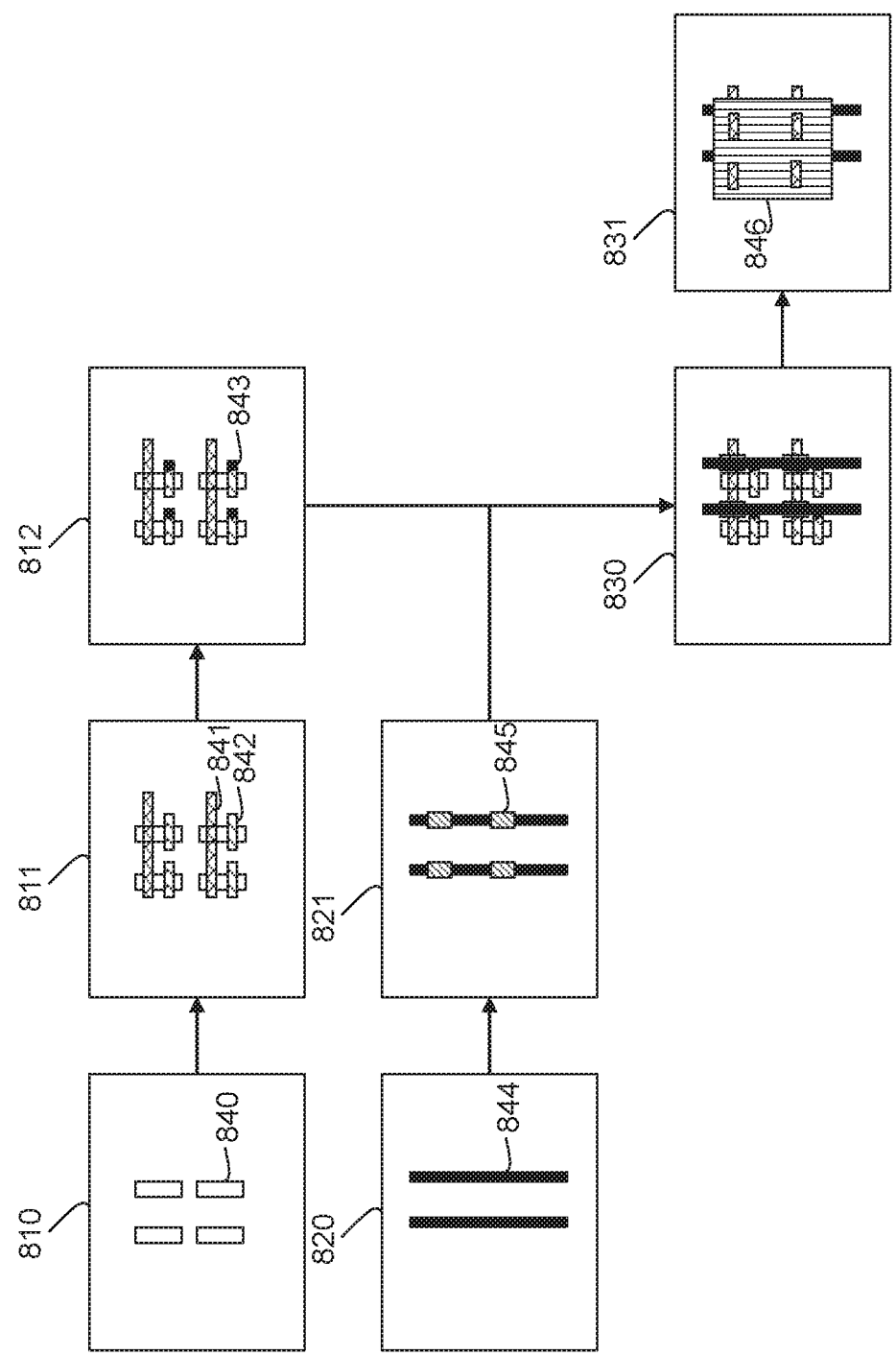
FIG. 8 is a flow diagram illustrating a method of fabricating a photodetector array according to at least one embodiment of the present disclosure.

In order to facilitate the creation of large arrays from smaller arrays, switching diodes and photo diodes may be fabricated on the same substrate. For this, a cathode-to-cathode or side-to-side connection of switching diodes and photo diodes is needed. FIG. 8 illustrates the process for achieving this according to at least one embodiment of the present disclosure.

The method of FIG. 8 is illustrated using an example material system and device structure of ITO/ZnO/Active layer/MoO$_x$/Ag, however the present disclosure is not limited to this example. The active layer may comprise PCDTBT:PC$_{70}$BM, ethoxylated polyethylenimine (PEIE), PCDTBT, or other suitable materials. In at least some embodiments, MoO$_x$ may be replaced with vanadium oxide (V$_2$O$_5$).

Furthermore, in at least some embodiments the same material system and device structure can be used for both the switching diodes and photo diodes. In at least some of these embodiments the device structure is selected from the following: ITO/ZnO/PCDTBT:PC$_{70}$BM/MoO$_x$/Ag, ITO/ZnO/PEIE/PCDTBT:PC$_{70}$BM/MoO$_x$/Ag, ITO/ZnO/PCDTBT:PC$_{70}$BM/V$_2$O$_5$/Ag, ITO/ZnO/PEIE/PCDTBT:PC$_{70}$BM/V$_2$O$_5$/Ag, and ITO/PEIE/PCDTBT:PC$_{70}$BM/MoO$_x$/Ag In at least some other embodiments, a different material system and device structure for the switching diodes and the photo diodes can be used. In at least some of these embodiments, the device structure for switching diodes is selected from the following: ITO/ZnO/PCDTBT:PC$_{70}$BM/PCDTBT/MoO$_x$/Ag, ITO/ZnO/PEIE/PCDTBT:PC$_{70}$BM/PCDTBT/MoO$_x$/Ag, ITO/ZnO/PCDTBT:PC$_{70}$BM/PCDTBT/V$_2$O$_5$/Ag, ITO/PEIE/PCDTBT:PC$_{70}$BM/PCDTBT/MoO$_x$/Ag, and ITO/ZnO/PEIE/PCDTBT:PC$_{70}$BM/PCDTBT/V$_2$O$_5$/Ag.

Further, in at least some of these embodiments, the device structure for photo diodes is selected from the following: ITO/ZnO/PCDTBT:PC$_{70}$BM/MoO$_x$/Ag, ITO/ZnO/PEIE/PCDTBT:PC$_{70}$BM/MoO$_x$/Ag, ITO/ZnO/PCDTBT:PC$_{70}$BM/V$_2$O$_5$/Ag, ITO/PEIE/PCDTBT:PC$_{70}$BM/PCDTBT/MoO$_x$/Ag, and ITO/ZnO/PEIE/PCDTBT:PC$_{70}$BM/V$_2$O$_5$/Ag.

In at least some embodiments, the size ratio of switching diodes to photo diodes is as large as 1:1 and as small as 1:5.

Referring to FIG. 8, at block 810, ITO is patterned as bars 840 and covered by ZnO and an active layer, as illustrated by the four white rectangles. The method then proceeds to block 811, where molybdenum oxide (MoO$_x$) and then silver (Ag) are deposited in sequence, as illustrated by the horizontal bars 841 and 842. Then, at block 812, conductive adhesive 843 is dispensed on the bonding area of the silver bars, as illustrated by a black portion. As seen in block 812, the conductive adhesive 843 is positioned adjacent to the intersection of ITO and MoO$_x$ and Ag, as this improves yield by not subjecting the resulting diodes to stress resulting from the bonding process. However, the present disclosure is not limited to this embodiment.

At block 820, conductive lines 844 are screen-printed on a separate PET film (called backplane sheet). Then, at block 821, dielectric lines 845 are screen-printed on the conductive lines, as illustrated by the four rectangles shown in block 821. At block 830, conductive lines 844 are bonded to the silver bars through conductive adhesive 843. Insulation between the deposited silver lines 841 and the printed conductive lines 844 is achieved through the screen printed dielectric lines 845. At block 831, a light exposure mask 846 is attached to the back side of the obtained array. Each light-exposed zone functions as a photovoltaic diode and each light-blocked zone with the overlap of ITO and silver functions as a switching diode.

Conductive lines 844 extend across the entire array and provide the column connection for the passive matrix, while silver lines 841 extend across the entire array and provide the row connection for the passive matrix.

Figure 9:
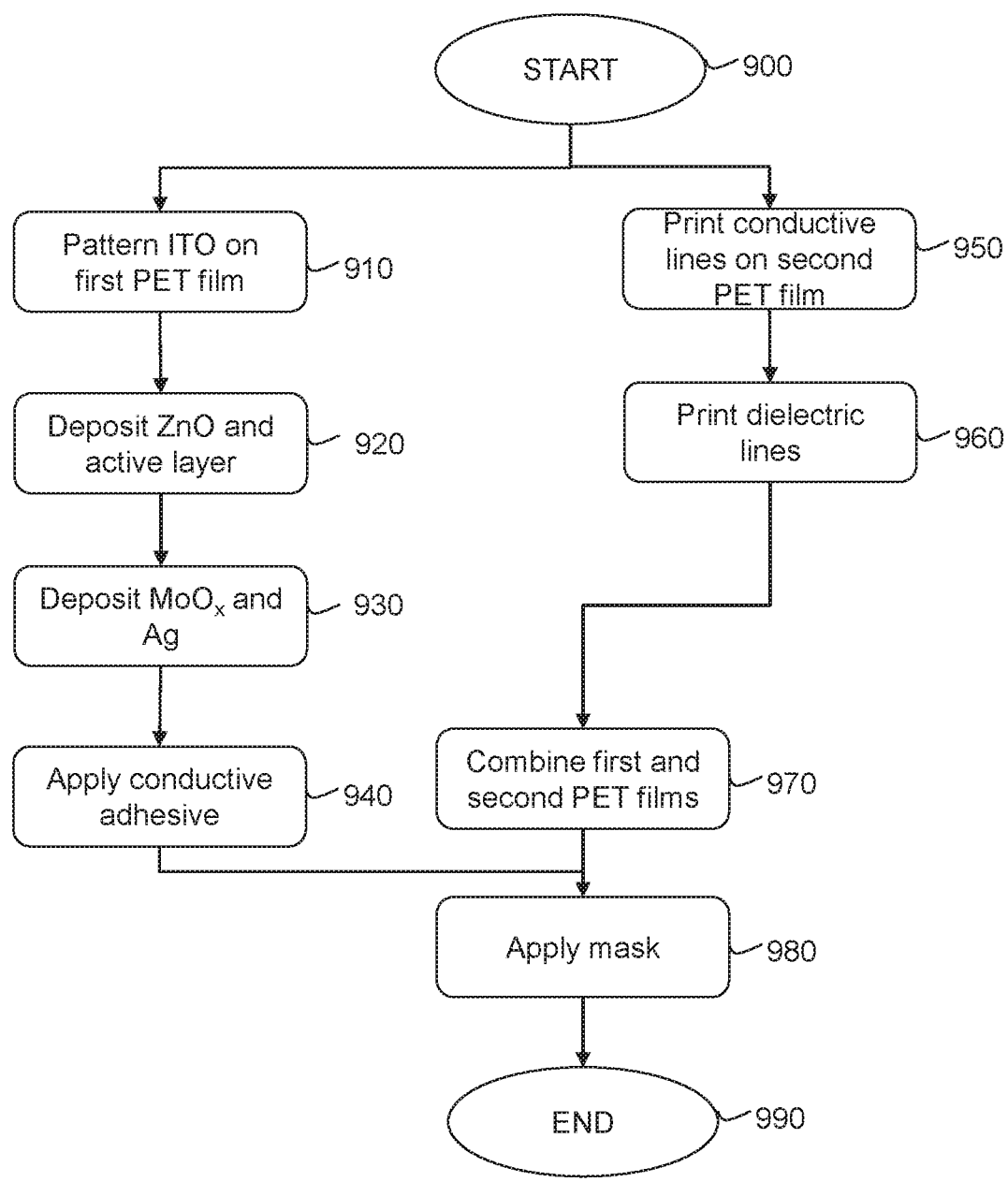
FIG. 9 is a flow diagram illustrating a method of fabricating a photodetector array according to at least one embodiment of the present disclosure.

Reference is now made to FIG. 9, which provides a further illustration to the process of FIG. 8. The process starts at block 900 and proceeds to block 910 and to block 950. Blocks 910 and 950 and their respective branches may be performed simultaneously or consecutively, until block 970, where they converge.

At block 910, ITO is patterned on a PET film. In at least one embodiment, the PET film is pre-coated with ITO and etchant is printed thereon to create the required pattern. At block 920, ZnO and active layer are deposited. Notably, the step of block 920 does not need patterning. At block 930, MoO$_x$ and Ag are deposited according to the required pattern. In at least one embodiment, MoO$_x$ deposition can be replaced with flexo printing or gravure printing of a vanadium oxide solution. Also, in at least one embodiment, Ag deposition can be replaced with flexo printing or gravure printing of silver nano particle ink. At block 940, conductive adhesive is applied. As discussed above, in at least one embodiment the conductive adhesive is applied away from the intersection of the ITO and the active layer. In at least one embodiment, the conductive adhesive is applied on a different PET film as discussed below.

At block 950, conductive lines are printed on a second PET film. Then, at block 960, dielectric lines are screen-printed on the conductive lines. In at least one embodiment, the conductive adhesive is applied on the conductive on the second PET film if it was not applied on the first PET film.

At block 970, the first PET film and the second PET film are bonded together using the conductive adhesive applied at block 940. The first PET film and the second PET film are oriented so that the printed material on each PET film faces each other prior to bonding.

At block 980, a light exposure mask is applied, and the method ends at block 990.

The switching diodes and photo diodes can be fabricated using the same material system and device structure or different material systems and device structure. When one material system and device structure is used for both switching diodes and photo diodes, blade coating or die slot coating can be used to coat the above ZnO and active layer for both the diodes without patterning, and vapor deposition can be used to deposit patterned MoO$_x$ and Ag for both diodes in the same process.

In another example, one 16×16 array with side-to-side connection of switching diodes and photo diodes was prepared by blade coating ZnO nano particles and PCDTBT:PC$_{70}$BM subsequently on a bar-patterned ITO PET film, and then depositing MoO$_x$ and Ag in sequence. The obtained array comprised switching diodes formed in the overlapping area of ITO columns on the bottom and silver bars on top, and photo diodes formed in the overlapping area of ITO columns on the bottom and silver column on top. It should be noted that the photo diodes and the switching diodes may be interchanged by a mask, such that the photo diodes are exposed to illumination and the switching diodes are blocked from illumination by the mask. After epoxy conductive adhesive was deposited on the bonding section for each switching diode, the array was attached to the backplane sheet printed with sliver flake-based silver ink and acrylic-based dielectric ink using a screen printer. A 16×16 photodetector array was thus obtained.

With its device geometry and the above fabrication process, the 16×16 photodetector arrays fabricated using the above method were able to perform the equivalent detection performance as shown in FIGS. 5A and 5B but under stronger lighting conditions.

Figure 10:
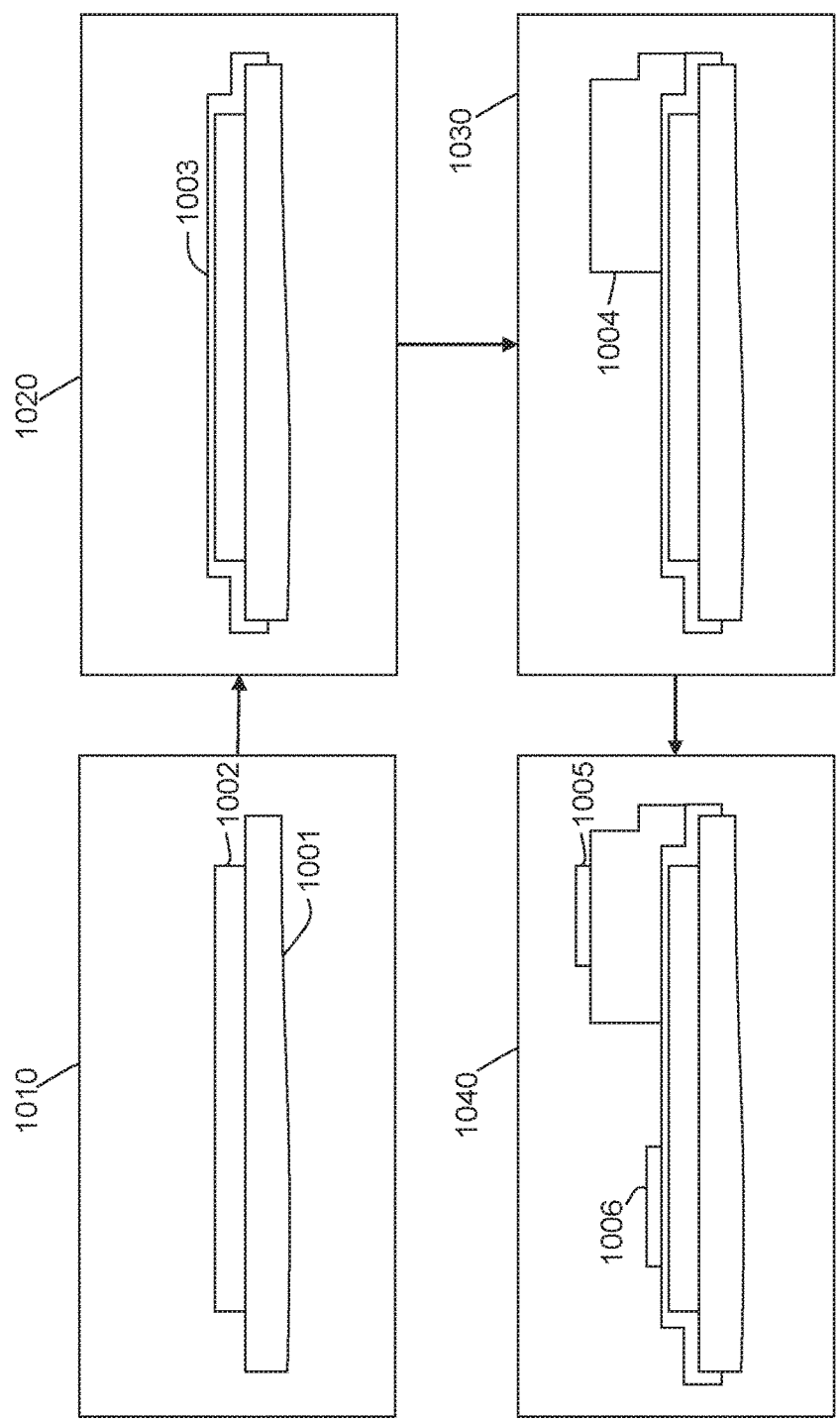
FIG. 10 is a flow diagram illustrating a method of fabricating a photodetector array according to at least one embodiment of the present disclosure.

Better light sensitivity can be achieved for the side-to-side connected photodetector arrays when the switching diodes are made of one material system and device structure and the photo diodes of a different material system and device structure. According to at least one embodiment of the present disclosure, a method is provided whereby an additional layer of polymer is incorporated over the area for switching diodes in the above described process. FIG. 10 illustrates this method with switching diodes fabricated using ITO/ZnO/PCDTBT:PC$_{70}$BM/PCDTBT/MoO$_x$/Ag, and photo diodes with ITO/ZnO/PCDTBT:PC$_{70}$BM/MoO$_x$/Ag, however the present disclosure is not so limited. The embodiment of FIG. 10 creates switching diodes and photo diodes connected in side-to-side fashion.

As seen in FIG. 10, at block 1010, ITO bars 1002 are patterned on a PET substrate 1001. As will be appreciated, the images in FIG. 10 represent cross-sections of a photodetector array.

The method proceeds to block 1020, where ITO bars 1002 are coated with ZnO and a photo active layer 1003. According to at least one embodiment, the photo active layer comprises PCDTBT:PC70BM. Further, according to at least one embodiment, the ZnO and photo active layer 703 is coated using an optimized device structure and a process for maximizing the photo sensitivity of the photo diodes.

The method then proceeds to block 1030, where a layer of PCDTBT 1004 is printed over a section selected for switching diodes. According to at least some embodiments, the layer of PCDTBT 1004 is printed using a local coating process such as flexo or gravure printing.

The method then proceeds to block 1040, in which MoO$_x$ and Ag 1005 are deposited on the area for photo diodes and on the area for switching diodes. As will be appreciated, the area for switching diodes corresponds to the area in which the layer of PCDTBT 1004 is printed. In at least one embodiment, MoO$_x$ and Ag 1005 and 1006 are deposited in a combined process for the switching diodes and the photo diodes. In at least another embodiment, one process is used to deposit MoO$_x$ and Ag 1005 for switching diodes and another process is used to deposit MoO$_x$ and Ag 1006 for photo diodes.

According to at least some embodiments, arrays with side-to-side connection of switching diodes and photo diodes are connected to each other using a special master backplane sheet. Standard connectors may be used to integrate each photodetector array.

For example, in at least one embodiment, a backplane sheet is screen printed with flake-based silver ink and dielectric ink on PET film for integrating four 16×16 photodetector arrays with side-to-side connection of switching diodes and photo diodes to obtain a 32×32 photodetector array. Silver lines provide vertical connections with the four 16×16 arrays, in-plane connections between the arrays, as well as the connection to cable connectors. A dielectric pattern may provide localized electric insulation between the backplane and the photodetector arrays. A 16-channel grouped connection may be provided for commercial off-the-shelf 16-channel connectors.

Using the same process as described in FIG. 8 for attaching one 16×16 array to its corresponding backplane, four of these arrays were attached to a master backplane sheet in one trial. On top of the attached arrays, a light exposure mask that was screen-printed with a layer of Ultra Violet (UV) opaque acrylic ink and a layer of solvent-based black ink was placed and bonded to the backplane sheet with a UV acrylic adhesive. With their unprinted side facing out, the light exposure mask film and the backplane sheet also provided physical protection and moisture barrier for the photodetector array, while the adhesive held them together and provided a seal.

The above described method therefore allows to enlarge a photodetector array from a size of about 100 cm$^2$ for each 16×16 array to 400 cm$^2$ for a 32×32 array. When a master backplane sheet which is able to house more arrays is used, even larger arrays can be fabricated. According to at least one embodiment, sixteen 16×16 arrays are integrated to produce a 64×64 array with a size of 1600 cm$^2$. Therefore, large arrays with high cell counts may be fabricated. The performance of the large arrays is governed by the performance of the small arrays that make up the large arrays, and the performance of the small arrays is ensured by the controllable sheet-to-sheet fabrication process described herein.

Figure 11:
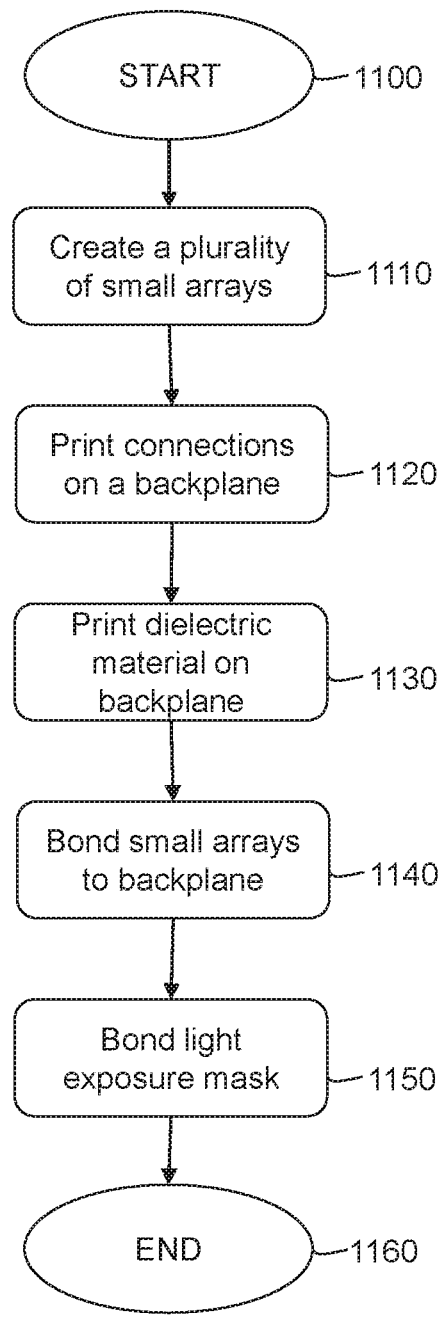
FIG. 11 is a flow diagram illustrating a method of fabricating a large photodetector array according to at least one embodiment of the present disclosure.

Reference is now made to FIG. 11, which illustrates a method for fabricating large photodetectors array.

The process begins at block 1100, and proceeds to block 1110 where a plurality of small arrays are fabricated. The small arrays may be fabricated using the techniques described herein, but the present disclosure is not so limited and the method of FIG. 11 could be adapted to use small arrays fabricated using prior art methods. In at least one embodiment, the small arrays are 16×16 arrays, but the present disclosure is not limited to any particular size for the small arrays, and smaller or larger arrays are contemplated. In at least one embodiment, the small arrays are fabricated on a flexible PET film.

The method then proceeds to block 1120 where connections are printed on a master backplane sheet. The connections printed at block 1120 may be printed with flake-based silver ink, in at least one embodiment. The connections are patterned to provide vertical connections with the arrays, connections between the arrays and connections between the arrays and external connectors.

The method then proceed to block 1130 in which a dielectric pattern is printed on the backplane sheet. The dielectric pattern provides localized electric insulation between the backplane and the arrays.

The method then proceeds to block 1140 where the small arrays are bonded to the backplane. Then, at block 1150, a light exposure mask is bonded to the backplane sheet. According to at least one embodiment, the light exposure mask is screen-printed with a layer of UV-opaque acrylic ink and a layer of solvent-based black ink. According to at least one embodiment, the light exposure mask is bonded to the backplane sheet using a UV acrylic adhesive.

The method then proceeds to block 1160 and ends.

The above described method for creating a large photodetector array may be used to create ever larger photodetector arrays, until a limit where it becomes too difficult in handling the size of the photodetector array, or the large number of detector cells creates significant crosstalk. When approaching such a limit, large arrays can be used as a module and even larger array panels may be built by connecting several modules together. In this scenario, detection may be performed one module at a time to limit the possibility of crosstalk associated with a high cell count.

By fabricating the small or starting arrays on a flexible substrate (e.g. PET films), and using a master backplane sheet and light exposure mask also printed on a flexible substrate (e.g. PET films), the obtained large array panels are flexible. The panels are also all printable. Every component of photodetector arrays fabricated according to the present disclosure, namely the master backplane sheet, mask cover, and the small arrays, may be created by a printing process. Screen printing may be used for printing etchant on an ITO-coated PET to pattern ITO.

Besides the screen printing-created master backplane sheet and mask cover, all the involved processes for fabricating the small array are printing or printable. Screen printing is used to print etchant on ITO-coated PET to pattern ITO. ZnO and active layers may be blade coated or they may be slot-die coated. The additional layer of polymer for switching diodes may be printed with flexo printing or gravure printing. The $MoO_x$ deposition can be replaced with flexo printing or gravure printing of a vanadium oxide solution. Ag deposition can be replaced with flexo printing or gravure printing of silver nano particle ink.

According to a further aspect of the present disclosure, there is also provided a method of reading the output of the photodetector arrays based on individualized decision thresholds. As described earlier, photodetector arrays fabricated according to the present disclosure have an array of diodes which function as switches by controlling the bias direction. Accordingly, each photo diode connects to a non-photosensitive switching diode in a head-to-head or tail-to-tail fashion.

When just enough negative voltage is applied to a pair of a switching diode and a photo diode, the switching diode is turned off and no current from the photo diode may pass through the circuit. When just enough positive voltage is applied to the pair of diodes, the switching diode is turned on and the current from the photo diode may pass through the circuit. In a matrix design, this voltage scan can be handled by a multiplexing circuit as shown in FIG. 12.

Figure 12:
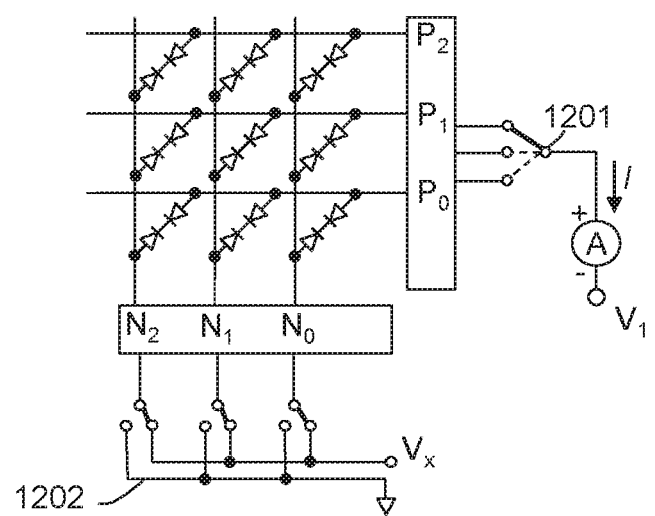
FIG. 12 is a schematic diagram of a circuit for estimating the current of each photodiode according to at least one embodiment of the present disclosure.

Each cell in FIG. 12 is identified by a pair of coordinates indicating a row, namely p, and a column, namely n. The current at a cell (p,n) is denoted by $I_{p,n}$. To estimate $I_{p,n}$, a selector 1201 is set to select row p, and a plurality of switches 1202 corresponding to the columns are set so that columns other than column n receive voltage $V_x$. In at least one embodiment, $V_1$ is greater than 0.6 volt, and $V_x$ is greater than ($V_1$+0.6) volts. The columns other than column n are biased by $V_1-V_x+0.6<0$, and their switching diodes are turned off, thereby blocking the current of their paired photo diodes. The switching diode at cell (p,n) is biased by $0.6-V_1\approx0$, and therefore its reverse current is read by the ammeter A as $-I$, where $I_{pn}\approx I$. Rows other than row p do not impact I because they are not selected by the selector 1201.

However, in order to detect small photo currents from a cell, the leakage from the unselected columns should be even smaller. The estimated current from a cell may not be accurate unless the reverse leakage currents of the switching diodes are negligibly small. While this condition can be easily met by conventional silicon diodes, printed diodes may not meet this condition, resulting in noise in photo-current estimates. Furthermore, the sensitivity of printed photodetectors may vary significantly more than silicon photodetectors.

The above problems with printed switching diodes and photodetectors may result in inconsistent correspondence between the estimated current value for a given photodetector and the actual illumination experienced by the photodetector. According to at least one embodiment, a binary decision is made whether each of the photodetector cells (a pair of a switching diode and a photo diode) is lit or obstructed. With silicon circuits, this is performed by choosing an appropriate current threshold which will be compared against the current from each photodetector cell to make a decision. However, with an array of printed photodetectors, this approach may lead to inconsistent results for the reasons discussed above.

Accordingly, there is provided a method of reading the current from a photodetector array based on individualized decision thresholds. Specifically, for each of the M×M pixels (or cells), there is an individual and independent decision threshold. Each of the M×M thresholds can be set to the most appropriate value for its corresponding pixel. On initialization or whenever necessary, values for these thresholds are determined through a calibration process, which is illustrated with respect to FIG. 13.

The method starts at block 1300 and proceeds to block 1310 where the photodetector array is subjected to darkness. This may be achieved by covering the photo array with opaque material. The method then proceeds to block 1320 where the current corresponding to each of the M×M pixels of the photodetector array is estimated. In at least one embodiment, each pixel's current is estimated several times and an average of the estimated current for each pixel is calculated.

The method then proceeds to block 1330 where the photodetector array is subjected to normal and unobstructed lighting condition. The method then proceeds to block 1340 where the current corresponding to each of the M×M pixels of the photodetector array is estimated. In at least one embodiment, each pixel's current is estimated several times and an average of the estimated current for each pixel is calculated.

Notably, steps 1330 and 1340 may be performed ahead of steps 1310 and 1320 in at least some embodiments.

The method then proceeds to block 1350 where the threshold for each pixel is set based on the current readings at each pixel under dark and light conditions. According to at least one embodiment, the threshold is determined as a weighted average of the corresponding pixel's average current under dark conditions and the corresponding pixel's average current under light conditions. According to at least one embodiment, the weighted average is calculated based on a user-selected weighting factor that may favor a finding of darkness or a finding of illumination.

Once each pixel has had its individual threshold determined, the thresholds are stored in a reader's memory until a further calibration is performed.

The method then proceeds to block 1360 and ends.

If there are any defective switching diodes or photo diodes in the array, the defective pixel's current under light conditions may be more positive (as opposed to more negative in a properly functioning pixel), than the defective pixel's current under dark conditions. Such a pixel may be identified by the calibration process illustrated at FIG. 13, and may be ignored in operation.

Figure 14:
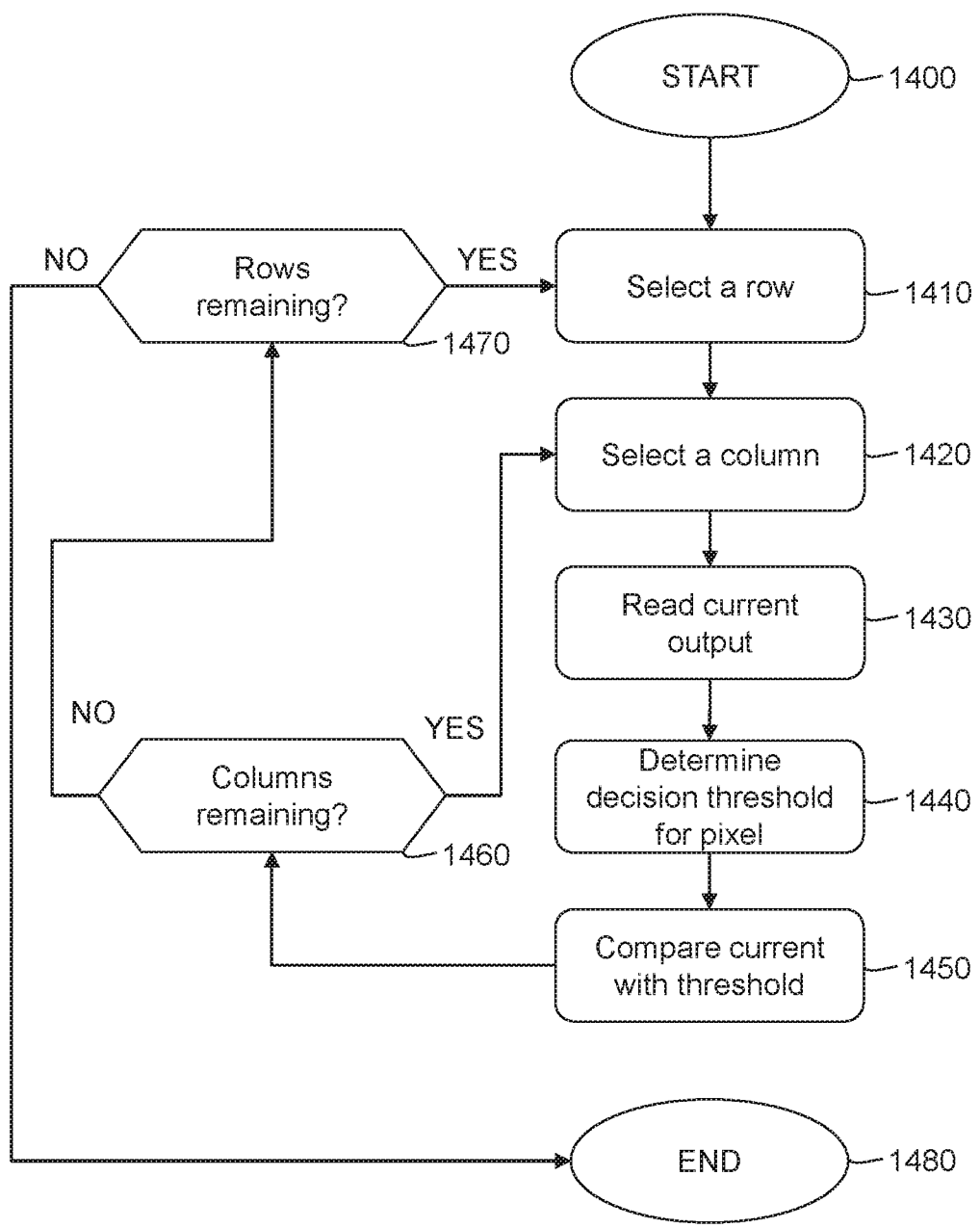
FIG. 14 is a flow diagram illustrating a method for reading the output of a photodetector according to at least one embodiment of the present disclosure.

Reference is now made to FIG. 14 which illustrates a method of reading the output from a photodetector array using individualized decision thresholds.

The method starts at block 1400 and proceeds to block 1410 where a row is selected. According to at least one embodiment a row may be selected using a row selector such as row selector 1201 from FIG. 12. The method then proceeds to block 1420 where a column is selected. According to at least one embodiment a column may be selected using a column selector such as column selector 1202 from FIG. 12.

Figure 13:
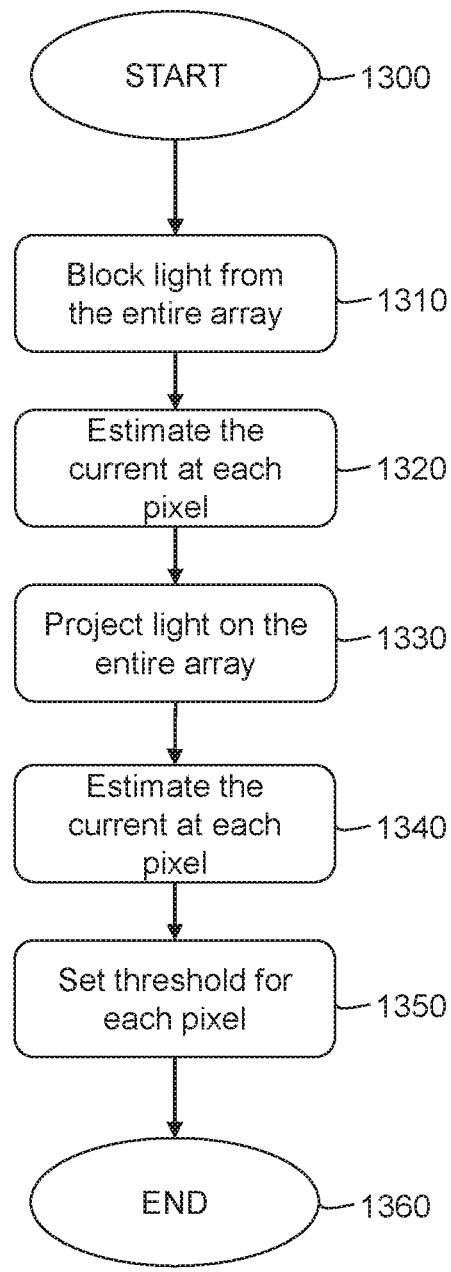
FIG. 13 is a flow diagram illustrating a method for calibrating individualized decision thresholds according to at least one embodiment of the present disclosure.

The method then proceeds at block 1430, where the current from the selected pixel is read. According to at least one embodiment, the current is read from an ammeter A from FIG. 12. At block 1440, the individualized decision threshold for the pixel corresponding to the selected row and column, as determined in the calibration process illustrated in FIG. 13, is read from memory, and compared with the current reading at block 1450. Based on the comparison, it is determined whether the pixel is subject to light or dark conditions.

The method proceeds to block 1460 where it is checked whether there are columns remaining for the selected row. If yes, another column is selected at block 1420. If no, the method proceeds to block 1470 where a check is made to determine whether there are rows remaining. If yes, another row is selected at block 1410. If no, the method ends at block 1480.

Further aspects of the disclosure are provided in the following clauses.

A. A method of fabricating a photodetector array comprising: assembling, on a face of a first substrate, an array of switching diodes; assembling on a face of a second substrate, an array of photo diodes; applying conductive adhesive at a bonding section of each switching diode; aligning the first substrate and the second substrate such that each photo diode is facing a corresponding switching diode; and bonding the first substrate to the second substrate using the conductive adhesive.

B. The method of clause A wherein the bonding section of each switching diode is on the switching diode.

C. The method of clause A wherein the bonding section of each switching diode is adjacent to the switching diode.

D. The method of clause A, further comprising forming, for each row of the array of switching diodes, first conductive lines connecting each switching diode within their respective row.

E. The method of clause D, further comprising forming, for each column of the array of photo diodes, second conductive lines connecting each photo diode within their respective row.

F. The method of clause E, further comprising placing insulating materials at each intersection of the first conductive lines and second conductive lines.

G. A photodetector array comprising a first substrate having printed thereon an array of switching diodes; a second substrate having printed thereon an array of photo diodes; conductive adhesive placed at a bonding section of each switching diode; wherein the first substrate and the second substrate are bonded by the conductive adhesive, and wherein each switching diode of the array of switching diodes is connected through the conductive adhesive to a corresponding photo diode of the array of photo diodes.

H. The photodetector array of clause G, wherein the bonding section of each switching diode is on the switching diode.

I. The photodetector array of clause G, wherein the bonding section of each switching diode is adjacent to the switching diode.

J. The photodetector array of clause G further comprising, for each row of the array of switching diodes, first conductive lines connecting each switching diode within their respective row.

K. The photodetector array of clause J further comprising, for each column of the array of photo diodes, second conductive lines connecting each photo diode within their respective column.

L. The photodetector array of clause K further comprising insulating material at each intersection of the first conductive lines and the second conductive lines.

M. A method of fabricating a large photodetector array comprising forming, on a backplane sheet, a plurality of conductive lines for providing vertical connections to each of a plurality of small photodetector arrays; bonding the plurality of small photodetector arrays on a backplane sheet; and bonding a light exposure mask over each of the plurality of small photodetector arrays.

N. The method of clause M, further comprising forming a plurality of second conductive lines on the backplane sheet, the second conductive lines providing connections between each of the small photo detector arrays and providing connections to cable connectors.

O. The method of clause M, wherein the plurality of small photodetector arrays comprises 4 small photodetector arrays.

P. The method of clause M, wherein the backplane sheet, the light exposure mask, and each of the plurality of small photodetector arrays are made from flexible material.

Q. A large photodetector array comprising a backplane sheet having formed thereon a plurality of conductive lines; a plurality of small photodetector arrays bonded to the backplane sheet and connected to the plurality of conductive lines; and a light exposure mask over each of the plurality of small photodetector arrays.

R. The large photodetector array of clause Q further comprising second conductive lines on the backplane sheet, the second conductive lines providing connections between each of the small photo detector arrays and providing connections to cable connectors.

S. The large photodetector array of clause Q wherein the plurality of small photodetector arrays comprises 4 small photodetector arrays.

T. The large photodetector array of clause Q wherein the backplane sheet, the light exposure mask, and each of the plurality of small photodetector arrays are made from flexible material.

U. A method of reading an output of a photodetector array comprising storing a threshold value for each of a plurality of pixels of the photodetector array; selecting a pixel for reading; determining a current associated to the selected pixel; comparing the determined current to the threshold value for the selected pixel; based on the comparing, deciding whether the pixel is illuminated.

V. The method of clause U, further comprising repeating the selecting, the determining, the comparing, and the deciding for each pixel of the photodetector array.

W. The method of clause U, further comprising, prior to the storing, calculating the threshold value for each of the plurality of pixels.

X. The method of clause U, wherein calculating the threshold value for a pixel comprises covering the photodetector array; selecting the pixel for reading; determining a first current associated to the selected pixel; illuminating the photodetector array; selecting the pixel for reading; determining a second current associated to the selected pixel; wherein the threshold value is an average of the first current and the second current.

Y. The method of clause X, wherein the average value is calculated by applying a weighting factor to at least one of the first current and the second current.

Although some embodiments are described in the form of methods alone, this is not meant to be limiting. Apparatus for carrying out part or all of these methods are also contemplated.

In addition, one or more the steps, methods, algorithms or other techniques according to the present disclosure may be performed automatically, meaning without any user intervention.

The structure, features, accessories, and alternatives of specific embodiments described herein and shown in the Figures are intended to apply generally to all of the teachings of the present disclosure, including to all of the embodiments described and illustrated herein, insofar as they are compatible. In other words, the structure, features, accessories, and alternatives of a specific embodiment are not intended to be limited to only that specific embodiment unless so indicated.

Furthermore, additional features and advantages of the present disclosure will be appreciated by those skilled in the art.

In addition, the embodiments described herein are examples of structures, systems or methods having elements corresponding to elements of the techniques of this application. This written description may enable those skilled in the art to make and use embodiments having alternative elements that likewise correspond to the elements of the techniques of this application. The intended scope of the techniques of this application thus includes other structures, systems or methods that do not differ from the techniques of this application as described herein, and further includes other structures, systems or methods with insubstantial differences from the techniques of this application as described herein.

Moreover, the previous detailed description is provided to enable any person skilled in the art to make or use the present invention. Various modifications to those embodiments will be readily apparent to those skilled in the art, and the generic principles defined herein may be applied to other embodiments without departing from the spirit or scope of the invention described herein. Thus, the present invention is not intended to be limited to the embodiments shown herein, but is to be accorded the full scope consistent with the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are known or later come to be known to those of ordinary skill in the art are intended to be encompassed by the elements of the claims. Moreover, nothing disclosed herein is intended to be dedicated to the public regardless of whether such disclosure is explicitly recited in the claims.

The invention claimed is:

1. A method of fabricating a photodetector array, comprising:

assembling, on a face of a first substrate, an array of photodetector pixels, wherein each photodetector pixel comprises a switching diode and a photo diode, the switching diode and the photo diode being connected with a cathode-to-cathode connection;

forming, for each row of the array, first conductive lines connecting each pixel within their respective row;

applying a conductive adhesive at a bonding section of each photodetector pixel;

forming, on a face of a second substrate second conductive lines for each column of the array;

placing a dielectric material layer on each second conductive line;

bonding the face of the first substrate with the face of the second substrate using the conductive adhesive;

placing a light exposure mask over the array, wherein the light exposure mask exposes every photo diode;

wherein positions of the dielectric material layers correspond to areas where the first conductive lines and the second conductive lines intersect.

2. The method of claim 1, wherein the bonding area of each photodetector pixel is adjacent to the switching diode and the photo diode.

3. The method of claim 1, wherein assembling the array of photodetector pixels comprises making the switching diode and the photo diode from the same material.

4. The method of claim 1, wherein assembling the array of photodetector pixels comprises making the switching diode from first materials and making the photo diode from second materials.

5. The method of claim 4, wherein the first materials comprise indium tin oxide (ITO), ZnO, poly(carbazole-dithiophene-benzothiadiazole) (PCDTBT): [6,6]-phenyl-C71-butyric acid methyl ester ($PC_{70}BM$), PCDTBT, $MoO_x$, and Ag, and the second materials comprise ITO, ZnO, PCDTBT:$PC_{70}BM$, $MoO_x$, and Ag.

6. The method of claim 1, wherein the first substrate and the second substrate are made of flexible material.

7. The method of claim 6 wherein the flexible material is polyethylene terephthalate (PET) film.

8. The method of claim 1, wherein the first substrate is made from indium tin oxide (ITO) coated polyethylene terephthalate (PET) film, and wherein assembling the array of photodetector pixels comprises:

printing etchant on the face of the first substrate to create a pattern of ITO.

9. The method of claim 8, wherein assembling the array of photodetector pixels comprises:

blade coating ZnO and an active layer over the pattern of ITO.

10. The method of claim 9, wherein assembling the array of photodetector pixels comprises:

printing a pattern of vanadium oxide solution, using at least one of flexo printing or gravure printing.

11. The method of claim 10, wherein assembling the array of photodetector pixels comprises:

printing a layer of polymer on the switching diode for each photodetector pixel, using at least one of flexo printing or gravure printing.

12. The method of claim 11, wherein the first conductive lines and the second conductive lines are created by printing silver nano particle ink, using at least one of flexo printing or gravure printing.

* * * * *